US006767672B2

(12) United States Patent
Hong et al.

(10) Patent No.: US 6,767,672 B2
(45) Date of Patent: Jul. 27, 2004

(54) METHOD FOR FORMING A PHASE-SHIFTING MASK FOR SEMICONDUCTOR DEVICE MANUFACTURE

(75) Inventors: Ji-Suk Hong, Ichon-shi (KR); Hee-Bom Kim, Ichon-shi (KR); Sang-Sool Koo, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 69 days.

(21) Appl. No.: 09/886,984

(22) Filed: Jun. 25, 2001

(65) Prior Publication Data

US 2003/0068563 A1 Apr. 10, 2003

(30) Foreign Application Priority Data

Jun. 23, 2000 (KR) ........................................ 2000-34897

(51) Int. Cl.[7] ................................................ G03F 9/00
(52) U.S. Cl. ................................ 430/5; 430/22; 430/30
(58) Field of Search ............................... 430/5, 22, 30, 430/322, 323, 394; 216/12; 438/717

(56) References Cited

U.S. PATENT DOCUMENTS

| 5,354,632 A | * | 10/1994 | Dao et al. ........................ 430/5 |
| 5,482,799 A | * | 1/1996 | Isao et al. ....................... 430/5 |
| 5,605,776 A | * | 2/1997 | Isao et al. ....................... 430/5 |
| 5,906,910 A | * | 5/1999 | Nguyen et al. ............... 422/241 |
| 6,120,942 A | * | 9/2000 | Reinberg ......................... 430/5 |
| 6,132,908 A | * | 10/2000 | Shiraishi et al. ............... 430/5 |
| 6,524,755 B2 | * | 2/2003 | Jin et al. ......................... 430/5 |

* cited by examiner

*Primary Examiner*—Mark F. Huff
*Assistant Examiner*—Kripa Sagar
(74) *Attorney, Agent, or Firm*—Pillsbury Winthrop LLP

(57) ABSTRACT

The present invention relates to a method for forming a multi-transmittance phase-shifting mask for the manufacture of highly integrated semiconductor devices in which portions of a plurality of light blocking layers are selectively removed to modify the transmittance of various regions of the mask and suppress undesired patterns, such as ghost images and side lobe effects to permit increased integration levels and improved yield in the production of the semiconductor devices.

14 Claims, 10 Drawing Sheets

METHOD FOR FORMING A PHASE-SHIFTING MASK FOR SEMICONDUCTOR DEVICE MANUFACTURE

FIELD OF THE INVENTION

The present invention relates to a method for forming a phase-shifting mask for the production of semiconductor devices and, more particularly, to a method for improving the lithographic resolution using a multi-transmittance phase-shifting mask

DESCRIPTION OF THE PRIOR ART

Generally, each level of semiconductor device circuitry is first generated on one or more photomasks that are, in turn, used in order to form the corresponding circuitry on a wafer surface. Typically, a series of reticles are generated in pattern generation works from the recorded circuit design data and, a master mask is then formed using the reticles. Attenuated phase-shifting masks used in DRAM fabricating processes, may be broadly classified into two types based on the way in which they are used. The first type is intended to increase the processing margin for forming linear spaces and the second is intended to increase the depth of focus for forming contact holes.

FIGS. 1A and 1B provide plan and cross-sectional views illustrating conventional attenuated phase-shifting masks. The upper figure is the cross-sectional view taken along the line A—A in the lower figure. In the drawings, chromium patterns 11 are formed on predetermined area of a quartz substrate 10. Further, FIG. 1A illustrates a conventional attenuated phase-shifting mask for forming fine patterns of lines and spaces with an expected processing margin.

FIG. 1B, however, illustrates a conventional attenuated phase-shifting mask for forming contact holes. The upper figure is the cross-sectional view taken along the line B—B in the lower figure. Generally, the chromium patterns designed and printed on the quartz substrate 10 are larger than the actual size of the pattern formed on a wafer. That is, the contact hole patterns are formed to provide a depth of focus (DOF) capable of resolving any size differences between mask pattern according to the design and the actual wafer-level patterns.

FIG. 1B shows an attenuated phase-shift mask having a transmittance of about 5 to 9% through the chromium patterns. If an amount of the transmittance level is a little high, interference may be generated by light transmitted through adjacent areas, thereby forming undesired patterns such as ghost images and side lobes. The use of the attenuated phase-shift mask with a low transmittance level, therefore, will tend to improve the resolution of fine patterns by suppressing the undesired patterns.

The size of the mask patterns may be also reduced in order to form correspondingly smaller patterns on the wafer, but the degree to which the size of the mask pattern may be reduced will be limited by design rules associated with the mask forming processes. In particular, with the reduction of the size of the patterns, the processing margin can be reduced so dramatically that both a low transmittance mask and a high transmittance mask are required simultaneously to reproduce a single pattern with the desired accuracy. Accordingly, in those cases where only one mask, either a low transmittance mask or high transmittance mask, is used in the patterning process, the process performance is compromised. Indeed, the benefits of the non-selected mask are simply lost and the pattern produced will be less than optimal.

SUMMARY OF THE INVENTION

It is, therefore, an object of the present invention to provide a method for improving resolution in the formation of photoresist patterns by using a multi-transmittance phase-shifting mask having both low transmittance and high transmittance regions.

It is another object of the present invention to improve the processing margin in fabricating semiconductor devices and improve the appearance of photoresist patterns and the resulting semiconductor devices.

In accordance with an aspect of the present invention, there is provided a method for forming a photomask for a semiconductor device, the method comprising the steps of: forming a plurality of light blocking layers and a phase-shifting layer on a transparent substrate; defining at least two different areas that require different transmission levels in order to best pattern the semiconductor device; determining the necessary level of transmission of the exposing light based on the defined areas; and selectively patterning the light blocking layers and the phase-shifting layers using a photoresist layer as an etching mask to control transmittance of exposure light in the defined areas.

In accordance with another aspect of the present invention, there is provided a method for forming a photomask for a semiconductor device, wherein the semiconductor device has a scribe lane, a peripheral circuit area and a cell area, the method comprising the steps of: forming a first stacked structure on the a scribe lane with a first transmittance of 0% for the exposing light, wherein the first stacked structure includes a plurality of light blocking layers; forming a second stacked structure on the peripheral circuit area with a second transmittance for the exposing light, wherein the second stacked structure includes at least one light blocking layer and a phase-shifting layer; and forming a third stacked structure on the cell area with a third transmittance for the exposing light, wherein the third stacked structure includes at least two light blocking layers and a phase-shifting layer.

BRIEF DESCRIPTION OF THE DRAWINGS

Other objects and aspects of the present invention will become apparent from the following description of the embodiments with reference to the accompanying drawings, in which.

DETAILED DESCRIPTION OF THE PREFERRED EMBODIMENTS

Hereinafter, the present invention will be described in detail referring to the accompanying drawings.

Figure 1A:
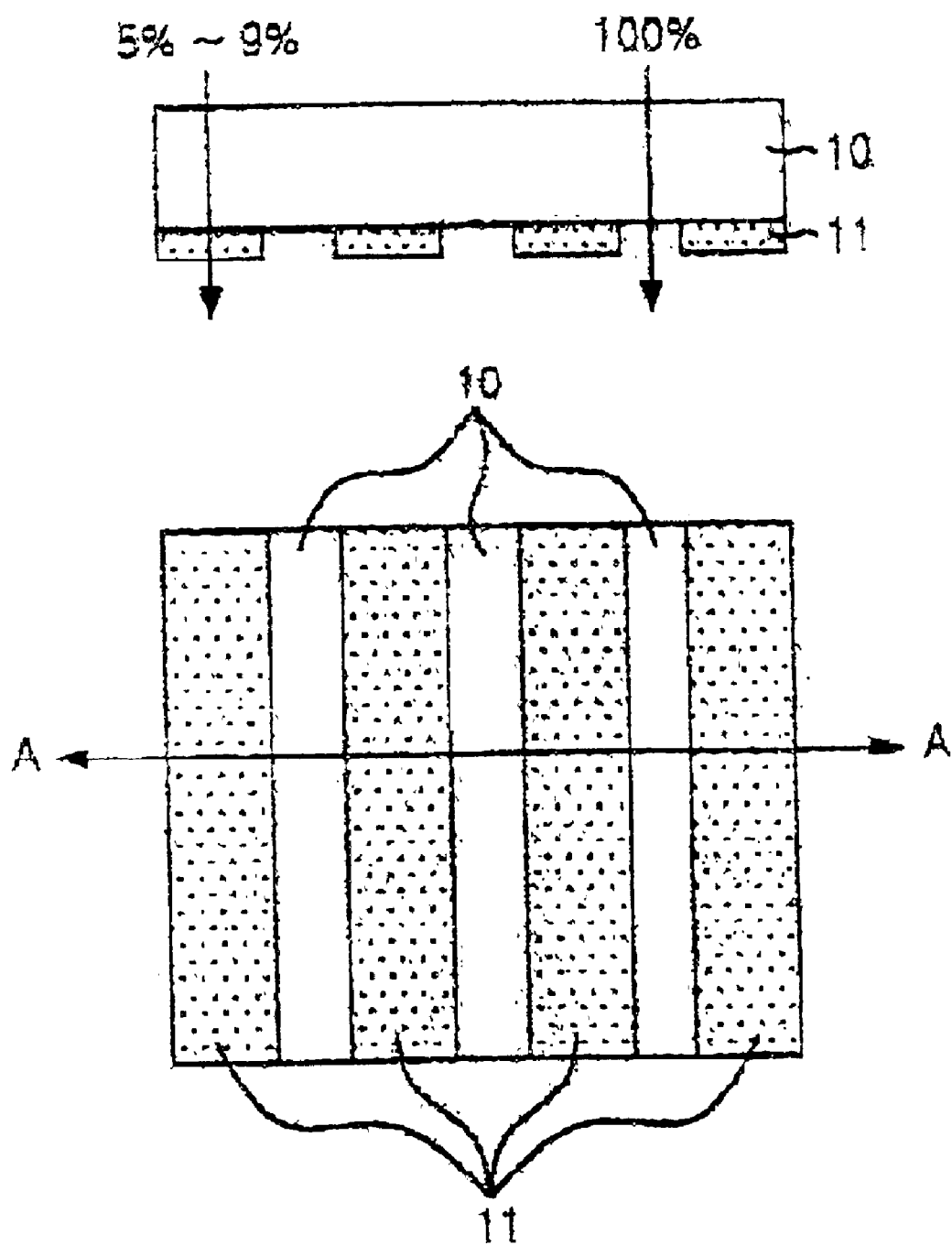
FIGS. 1A and 1B include plan and cross-sectional views illustrating conventional attenuated phase-shifting masks.
Figure 1B:
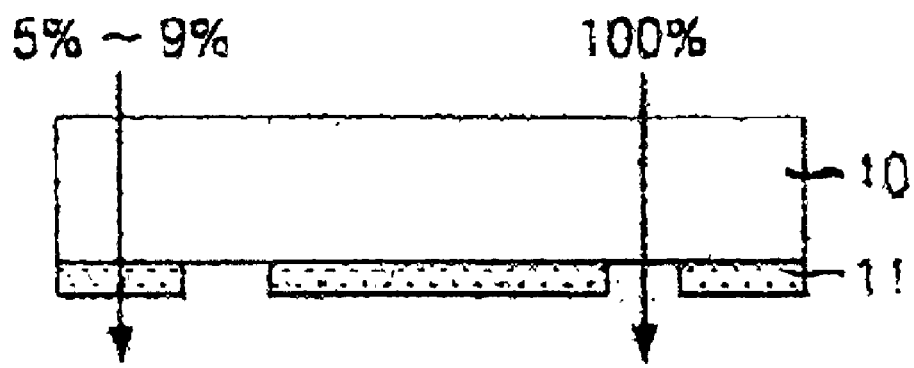
Figure 1B:
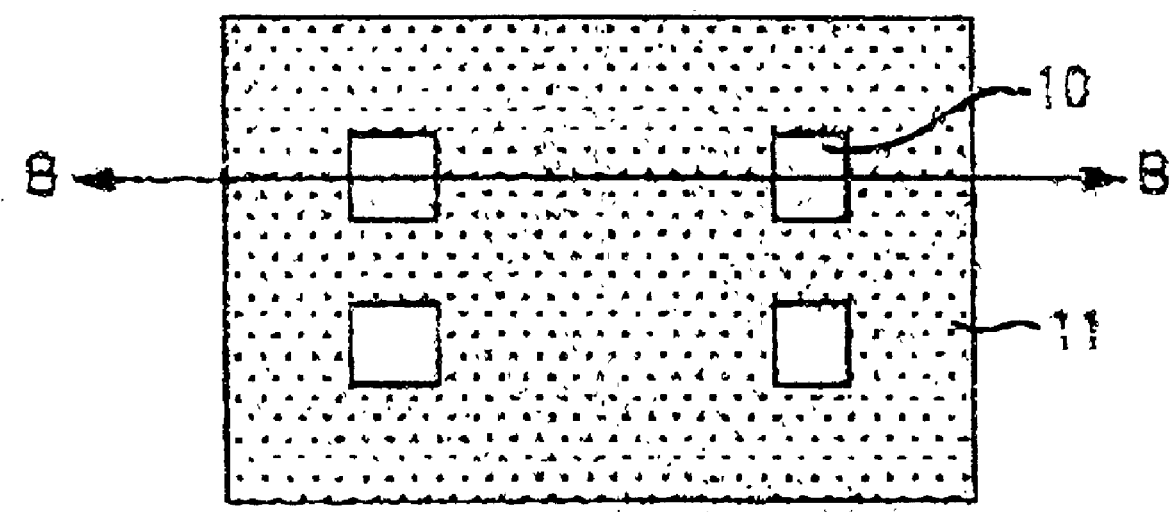
Figure 2:
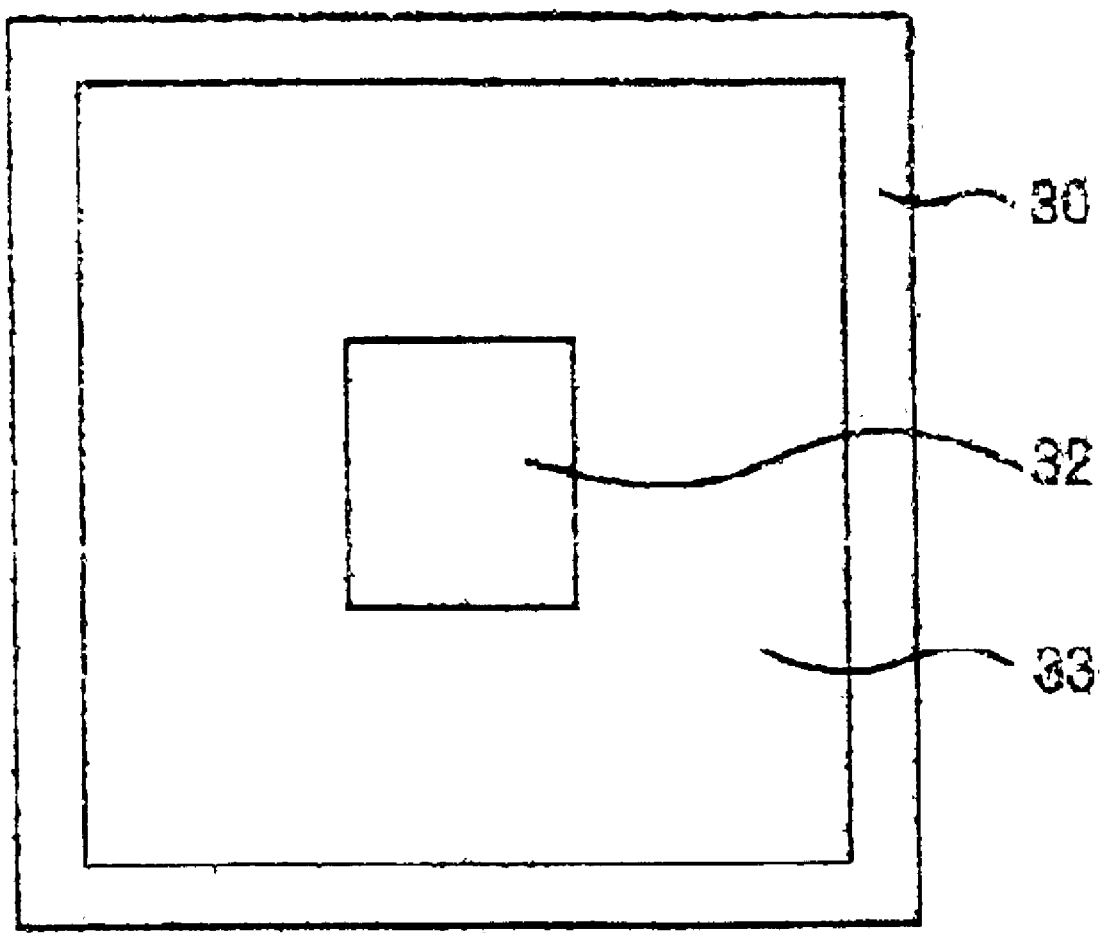
FIG. 2 illustrates a layout for a multi-transmittance phase-shifting mask according to an embodiment of the present invention.

FIG. 2 illustrates a simple multi-transmittance phase-shifting mask on a quartz substrate according to an embodiment of the present invention comprising a scribe lane 30, a region having a transmittance of 0%, a peripheral circuit area 33, a region having a high transmittance, and a cell area 32, a region having a low transmittance. As shown in FIG. 2, the phase-shifting mask according to the present invention has a different transmittance based on the desired characteristic of each area on the phase-shifting mask.

Figure 3A:
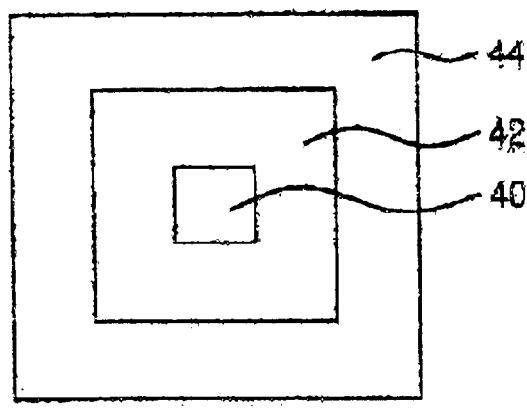
FIGS. 3A and 3B illustrate layouts of areas to which the multi-transmittance phase-shifting mask of FIG. 2 is applied.

FIG. 3A illustrates a contact hole pattern in the peripheral circuit area in which contact hole 40 is a region having a transmittance of 100% without any phase-shifting or chromium layers. An outer area 42 surrounding the contact hole 40 is a region having a high transmittance, and an edge area 44 is a chromium pattern region having transmittance of essentially 0% for preventing undesired patterns resulting from side lobe effects.

Figure 3B:
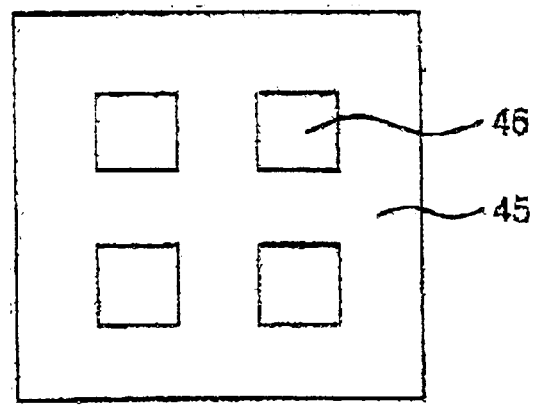

FIG. 3B illustrates a contact hole pattern in a cell area in which contact holes 46 are regions having a transmittance of 100% without any phase-shifting or chromium layers. FIG. 3 also illustrates an outer area 45 comprising a region surrounding the contact holes 40 that has a low transmittance.

FIGS. 4A to 4K are cross-sectional views illustrating a method for forming a multi-transmittance phase-shifting mask according to the present invention.

Figure 4A:
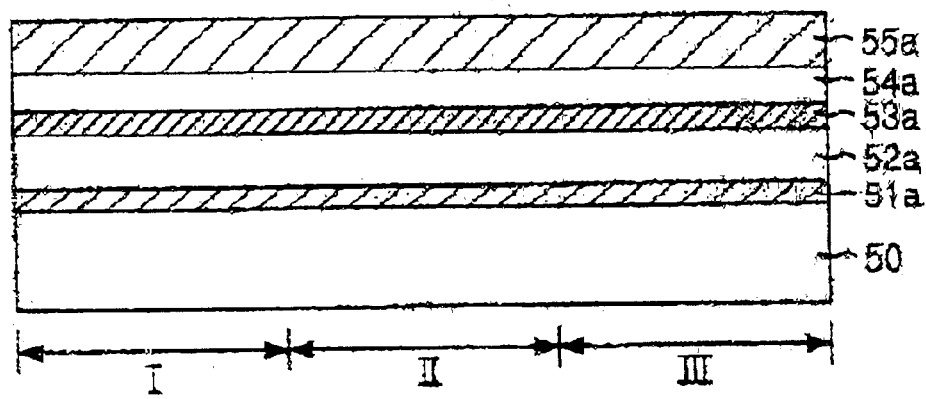
FIGS. 4A to 4K are cross-sectional views illustrating a method for forming the multi-transmittance phase-shifting mask according to the present invention.

First, referring to FIG. 4A, a chromium layer 51a, a phase-shifting layer 52a, a chromium layer 53a, a chromium layer 54a and a first photoresist layer 55a are sequentially formed on a quartz substrate 50. The substrate, as illustrated, includes a scribe lane area (I), a peripheral circuit area (II) and a cell area (III). In a preferred embodiment, the chromium layer 51a has transmittance of T1, the phase-shifting layer 52a, such as an oxide layer, has a phase difference of 180°, the chromium layer 53a has transmittance of T2 and the chromium layer 54a has transmittance of 0%.

Figure 4B:
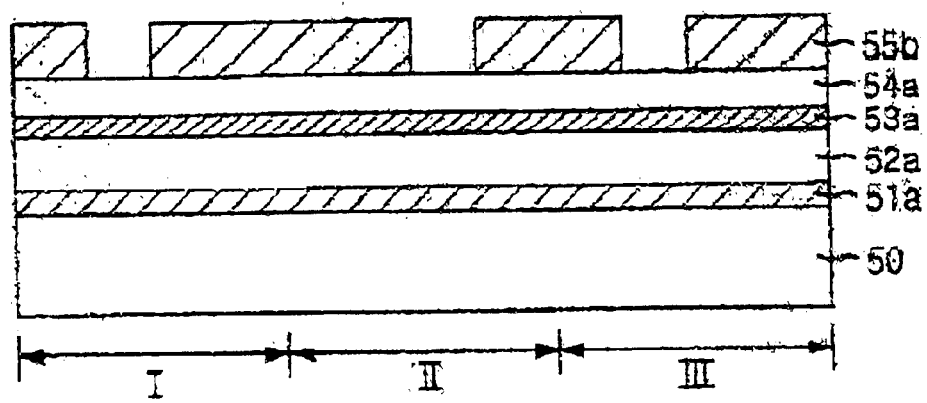

Referring to FIG. 4B, a first photoresist pattern 55b is formed by applying an exposure and development process to the first photoresist layer 55a, thereby exposing predetermined portions of the chromium layer 54a.

Figure 4C:
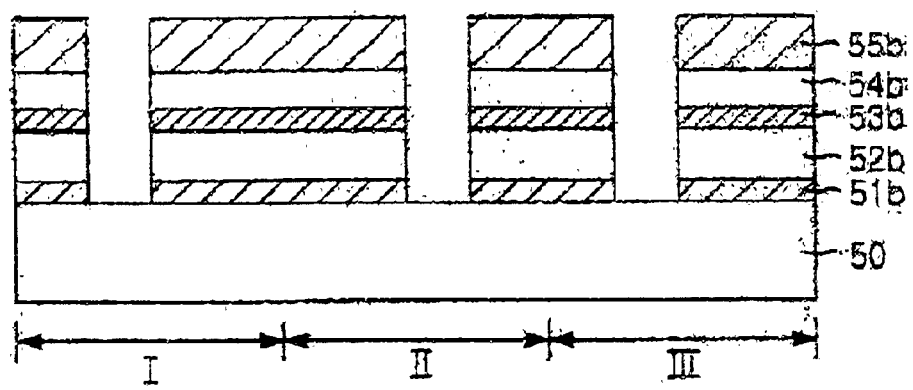

Referring to FIG. 4C, predetermined portions of the quartz substrate 50 are then exposed by selectively etching the chromium layer 54a, the chromium layer 53a, the phase-shifting layer 52a and the chromium layer 51a, respectively, thereby forming chromium pattern 54b, chromium pattern 53b, phase-shifting pattern 52b and chromium pattern 51b.

Figure 4D:
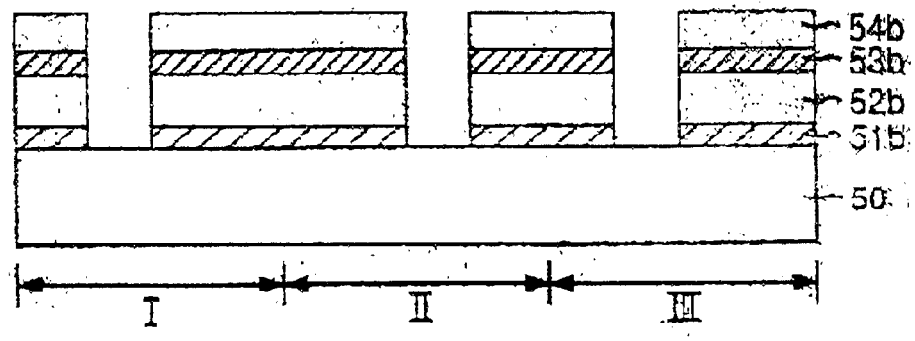
Figure 4E:
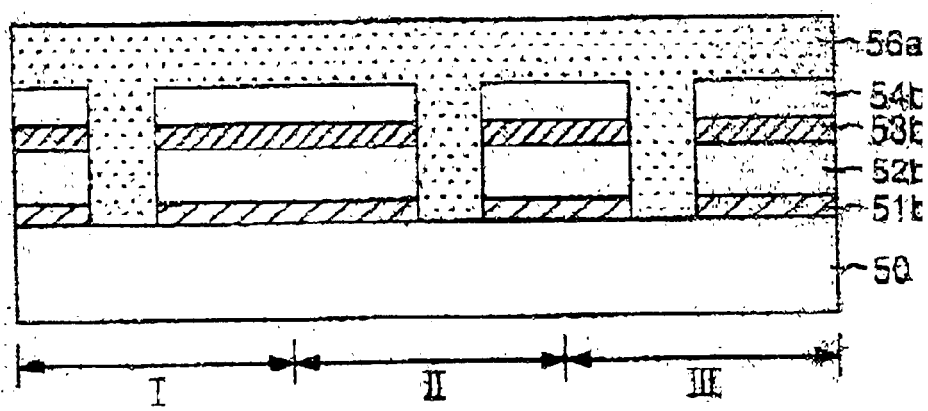

Referring to FIG. 4D, after exposing portions of the quartz substrate 50, the photoresist pattern 55b is removed and, referring to FIG. 4E, a second photoresist layer 56a is formed on the resulting structure.

Figure 4F:
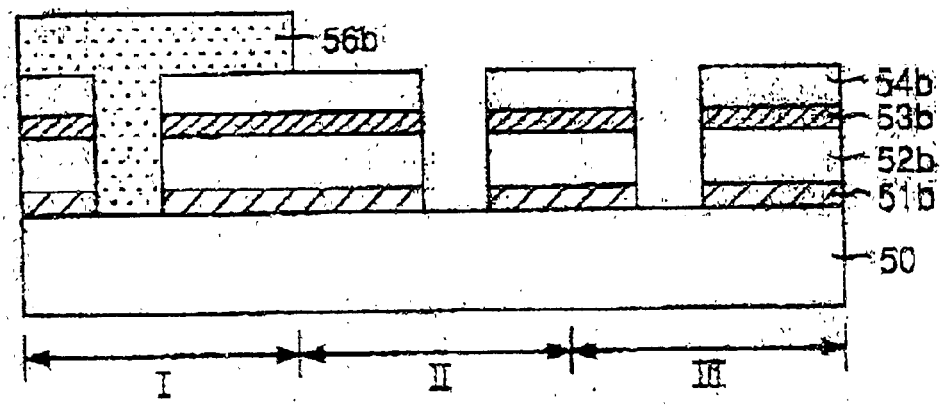

Referring to FIG. 4F, a second photoresist pattern 56b covering only the scribe lane area (I) exposing the peripheral circuit area (II) and the cell area (III), is then formed.

Figure 4G:
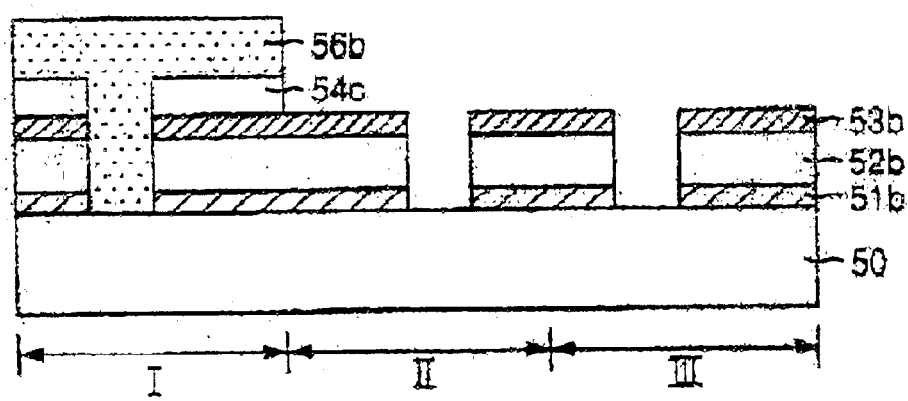

Next, referring to FIG. 4G, the exposed portion of chromium pattern 54b, i.e., those in the peripheral circuit area (II) and the cell area (III), are etched using the second photoresist pattern 56b as an etching mask to form chromium pattern 54c in the scribe lane area (I).

Figure 4H:
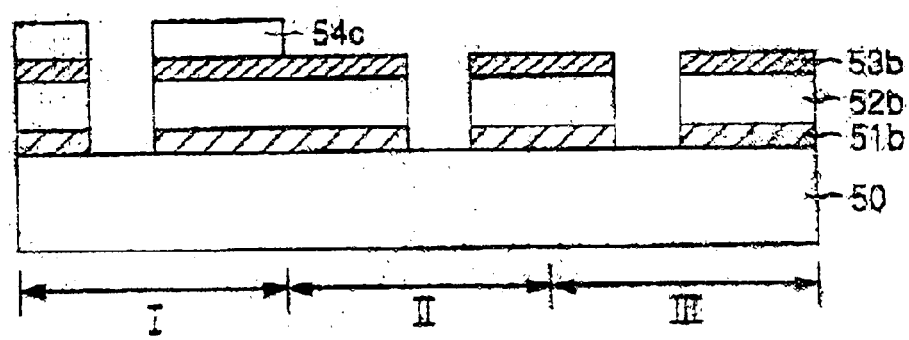
Figure 4I:
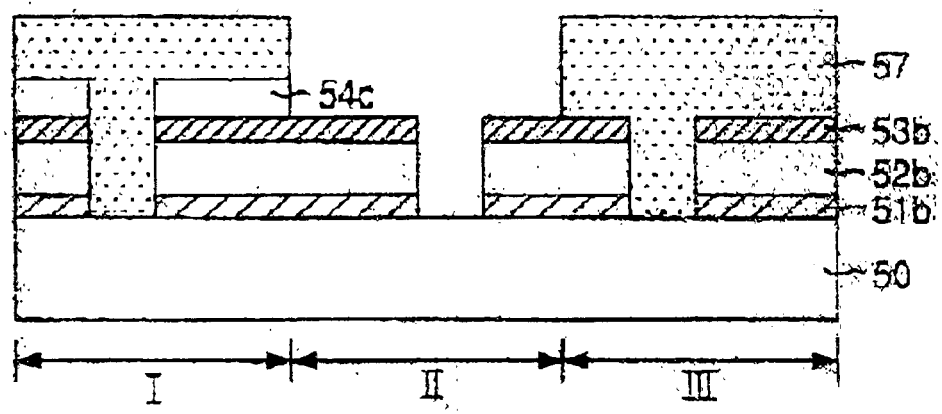

Referring to FIG. 4H, the second photoresist pattern 56b is then removed and, as illustrate in FIG. 4I, a third photoresist pattern 57 is formed in the scribe lane area (I) and the cell area (III), thereby exposing only the peripheral circuit area (II).

Figure 4J:
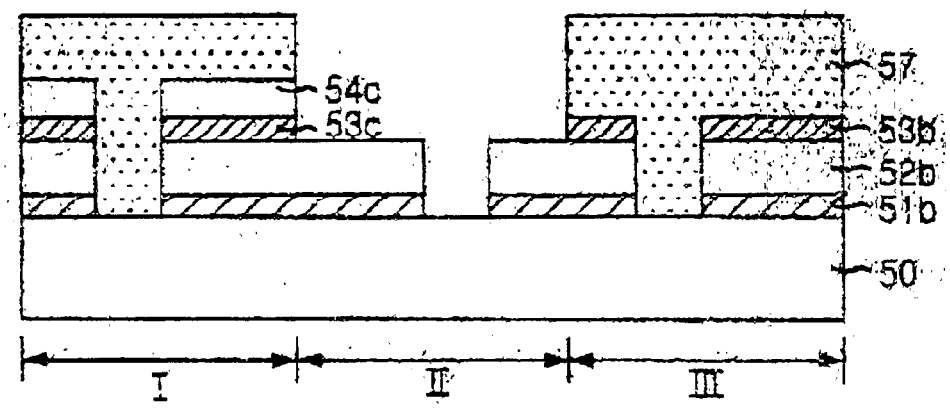

Referring to FIG. 4J, the portion of the chromium pattern 53b in the peripheral circuit area (II) is then etched using the third photoresist pattern 57 as an etching mask leaving only those portions of chromium pattern 53b that were formed in the scribe lane area (I) and the cell area (III) to form chromium pattern 53c.

Figure 4K:
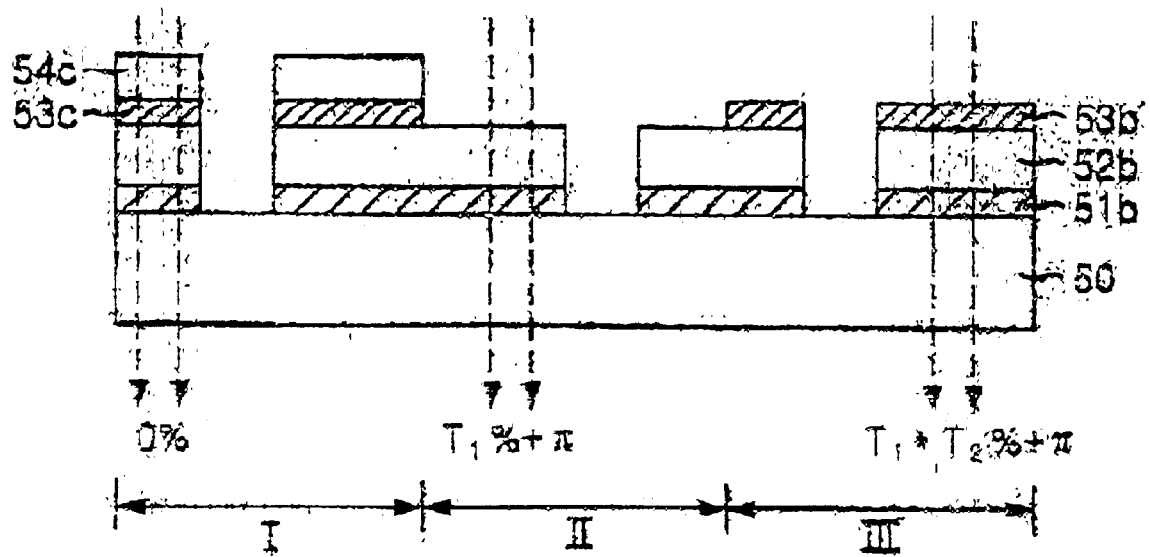

Finally, referring to FIG. 4K, the photoresist pattern 57 is removed and a multi-transmittance phase-shifting mask according to the present invention is complete. In the multi-transmittance phase-shifting mask according to the present invention, a stacked structure in the scribe lane area (I) includes the chromium pattern 51b, the phase-shifting pattern 52b, the chromium pattern 53c and the chromium pattern 54c. The light transmission through this stacked structure in the scribe lane area (I) is T1*T2*T3 with a phase-shift of n and is sufficient to cut off the light transmission from the stepper light source and produce a transmittance of 0%. The stacked structure in the peripheral circuit area (II), however includes only the chromium pattern 51b and the phase-shifting pattern 52b so that the peripheral circuit area (II) has a high transmittance of T1 with a phase-shift of n. Similarly, the stacked structure in the cell area (III) includes the chromium pattern 51b, the phase-shifting pattern 52b and the chromium pattern 53b so that the cell area (III) has a low transmittance of T1*T2 with a phase-shift of n.

As apparent from the above description, a phase-shifting mask according to the present invention provides a different light transmittance for different pattern areas such as the scribe lane, the peripheral circuit area and the cell area. This ability allows the transmittance to be tailored according to the desired characteristics of each area, thereby making such multi-transmittance masks highly compatible for the simultaneous formation of diverse elements on a semiconductor device. Accordingly, the present invention can suppress undesired patterns, such as ghost images and side lobe effects, and thereby improve the degree of integration of the semiconductor device and the production yield.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a multi-transmittance photomask on a transparent substrate comprising the steps of:

forming a first light blocking layer on the substrate;

forming a phase-shifting layer on the first light blocking layer;

forming a second light blocking layer on the phase-shifting layer;

forming a third light blocking layer on the second light blocking layer;

removing a portion of the third light blocking layer to define a first pattern area and expose a portion of the second light blocking layer;

removing a portion of the exposed portion of the second light blocking layer to define a second pattern area, the remaining portion of the third light blocking layer defining a third pattern area; wherein the first pattern area has a first transmittance P1 of an exposing light, the second pattern area has a second transmittance of P2 of the exposing light, and the third pattern area has a third transmittance P3 of the exposing light, having a relationship wherein P2>P1>P3.

2. A method for forming a multi-transmittance photomask on a transparent substrate according to claim 1, wherein the first, second and third light blocking layers are chromium layers, the first light blocking layer having a first transmittance T1 for the exposing light, the second light blocking layer having a second transmittance T2 for the exposing light, and the third light blocking layer having a third transmittance T3 for the exposing light.

3. A method for forming a multi-transmittance photomask on a transparent substrate according to claim 1, further comprising the step of forming an etch barrier layer on the second light blocking layer before forming the third light blocking layer.

4. A method for forming a multi-transmittance photomask on a transparent substrate according to claim 1, wherein the phase-shifting layer is an oxide layer and produces a phase-shift Π in the exposing light.

5. A method for forming a multi-transmittance photomask on a transparent substrate according to claim 4, wherein the etch barrier layer is substantially transparent to the exposing light.

6. A method for forming a multi-transmittance photomask on a transparent substrate according to claim 2, wherein T1≠T2, T2≠T3, and T1≠T3.

7. A method for forming a multi-transmittance photomask on a transparent substrate according to claim 2, wherein the first pattern area transmittance P1 is T1*T2+π;

the second pattern area transmittance P2 is T1+π; and the third pattern area transmittance P3 is T1*T2*T3+π.

8. A method for forming a multi-transmittance photomask on a transparent substrate according to claim 7, wherein T1*T2*T3+π<1%.

9. A multi-transmittance photomask on a transparent substrate having a first, second, and third pattern regions;

the first pattern region comprising a stacked structure of a first light blocking layer and a phase-shifting layer;

the second pattern region comprising a stacked structure of the first light blocking layer, the phase-shifting layer, and a second light blocking layer;

the third pattern region comprising a stacked structure of the first light blocking layer, the phase-shifting layer, the second light blocking layer, and a third light blocking layer.

10. A multi-transmittance photomask on a transparent substrate having a first, second, and third pattern regions according to claim 9, wherein the first, second and third light blocking layers are chromium layers.

11. A multi-transmittance photomask on a transparent substrate having a first, second, and third pattern regions according to claim 10, wherein the phase-shifting layer comprises an oxide.

12. A multi-transmittance photomask on a transparent substrate having a first, second, and third pattern regions according to claim 9, wherein the first pattern region transmits more of an exposing light than the second pattern region; and the second pattern region transmits more of the exposing light than the third pattern region.

13. A multi-transmittance photomask on a transparent substrate having a first, second, and third pattern regions according to claim 12, wherein the third pattern region has a transmittance of essentially 0% of the exposing light.

14. A method for forming a multi-transmittance photomask on a transparent substrate comprising the steps of:

forming a first light blocking layer on the substrate;

forming a phase-shifting layer on the first light blocking layer;

forming a second light blocking layer on the phase-shifting layer;

forming a third light blocking layer on the second light blocking layer;

forming a first photoresist pattern on the third light blocking layer;

etching the third light blocking layer, the second light blocking layer, the phase-shifting layer, and the first light blocking layer, using the first photoresist pattern as an etch mask, to form exposure openings;

removing the first photoresist pattern;

forming a second photoresist pattern to expose a portion of the third light blocking layer;

etching the third light blocking layer, using the second photoresist pattern as an etch mask, to define a first pattern area and thereby expose a portion of the second light blocking layer;

removing the second photoresist pattern;

forming a third photoresist pattern to expose a portion of the second light blocking layer in the first pattern area;

etching the exposed portion of the second light blocking layer in the first pattern area to define a second pattern area, the remaining portion of the third light blocking layer defining a third pattern area; and removing the third photoresist pattern, wherein the first pattern area has a first transmittance P1 of an exposing light, the second pattern area has a second transmittance of P2 of the exposing light, and the third pattern area has a third transmittance P3 of the exposing light, having a relationship wherein P2>P1>P3.

* * * * *